US012801024B2

(12) United States Patent
Yasunobe et al.

(10) Patent No.: US 12,801,024 B2
(45) Date of Patent: Nov. 17, 2026

(54) ILLUMINATING APPARATUS, MOLDING APPARATUS, AND METHOD FOR MANUFACTURING ARTICLE

(71) Applicant: CANON KABUSHIKI KAISHA, Tokyo (JP)

(72) Inventors: Osamu Yasunobe, Tochigi (JP); Hiroki Takada, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 82 days.

(21) Appl. No.: 18/926,675

(22) Filed: Oct. 25, 2024

(65) Prior Publication Data

US 2025/0138430 A1 May 1, 2025

(30) Foreign Application Priority Data

Nov. 1, 2023 (JP) ................................ 2023-187625

(51) Int. Cl.
*G03F 7/00* (2006.01)

(52) U.S. Cl.
CPC ........ *G03F 7/7005* (2013.01); *G03F 7/70516* (2013.01); *G03F 7/7085* (2013.01)

(58) Field of Classification Search
CPC .. G03F 7/7005; G03F 7/70516; G03F 7/7085; G03F 7/0002; F21V 23/0442; F21V 33/00; H05B 47/105; H05B 47/155; F21Y 2115/10
See application file for complete search history.

(56) References Cited

U.S. PATENT DOCUMENTS

| | | | | |
|---|---|---|---|---|
| 6,774,893 | B2 | 8/2004 | Debiez et al. | |
| 7,052,152 | B2 | 5/2006 | Harbers et al. | |
| 9,332,618 | B2 * | 5/2016 | Nagashima | F21V 23/0471 |
| 9,415,418 | B2 | 8/2016 | Sreenivasan et al. | |
| 12,078,925 | B2 * | 9/2024 | Fukuhara | G03F 7/0002 |
| 2019/0240880 | A1 * | 8/2019 | Sato | B29C 43/58 |

FOREIGN PATENT DOCUMENTS

| | | | |
|---|---|---|---|
| JP | 2005115372 | A | 4/2005 |
| KR | 1020160107324 | A | 9/2016 |

* cited by examiner

*Primary Examiner* — Hung V Nguyen
(74) *Attorney, Agent, or Firm* — ROSSI, KIMMS & McDOWELL LLP

(57) ABSTRACT

An illuminating apparatus, including: a light emitting portion; a mounting table on which an object irradiated with a light from the light emitting portion is mounted; a sensor configured to detect an amount of light emitted from the light emitting portion and reflected by the object; an adjusting unit configured to adjust a distance between the object and the sensor; and a controlling unit configured to control a light amount of the light emitting portion based on a detection result of the sensor in a state in which a distance between the object and the sensor is adjusted by the adjusting unit.

19 Claims, 6 Drawing Sheets

ILLUMINATING APPARATUS, MOLDING APPARATUS, AND METHOD FOR MANUFACTURING ARTICLE

BACKGROUND OF THE INVENTION

Technical Field

The present disclosure relates to an illuminating apparatus, a molding apparatus, and a method of manufacturing an article.

Description of the Related Art

In a photolithography process for manufacturing a device such as a semiconductor device, an exposure apparatus for transferring a pattern formed on an original (a mask or a reticle) to a substrate (a silicon substrate or a glass substrate) coated with a photosensitive agent is generally used.

In an exposure apparatus, miniaturization of a pattern to be transferred onto a substrate progresses, and even a slight change in exposure conditions causes an increase in defect rate and a decrease in yield.

Therefore, in the illumination optical system for illuminating the original, a defect in which the line width of the pattern formed on the substrate becomes uneven due to the illuminance unevenness in the illumination region is suppressed by making the integrated exposure light amount in the illumination region uniform. Japanese Patent Application Laid-Open No. 2005-115372 discloses that in a light source device (backlight for a liquid crystal display) having a plurality of light emitting diodes, the amount of diffused light or diffusely reflected light is detected by a sensor disposed in the vicinity of a light emitting portion, and the integrated exposure light amount is controlled to reduce illuminance unevenness due to non-lighting of the light emitting portion.

However, in the method of monitoring the amount of diffused light or diffusely reflected light, the influence of diffused light, diffusely reflected light, or the like other than the light emitting portion to be controlled cannot be ignored.

SUMMARY OF THE INVENTION

The present disclosure provides an illuminating apparatus that is beneficial for illuminating a surface to be illuminated.

According to an embodiment of the present disclosure, there is provided an illuminating apparatus, including: a light emitting portion; a mounting table on which an object irradiated with a light from the light emitting portion is mounted; a sensor configured to detect an amount of light emitted from the light emitting portion and reflected by the object; an adjusting unit configured to adjust a distance between the object and the sensor; and a controlling unit configured to control a light amount of the light emitting portion based on a detection result of the sensor in a state in which a distance between the object and the sensor is adjusted by the adjusting unit.

According to the present disclosure, it is possible to provide an illuminating apparatus beneficial for illuminating a surface to be illuminated.

Further features of the present disclosure will become apparent from the following description of exemplary embodiments with reference to the attached drawings.

DESCRIPTION OF THE EMBODIMENTS

Figure 1:
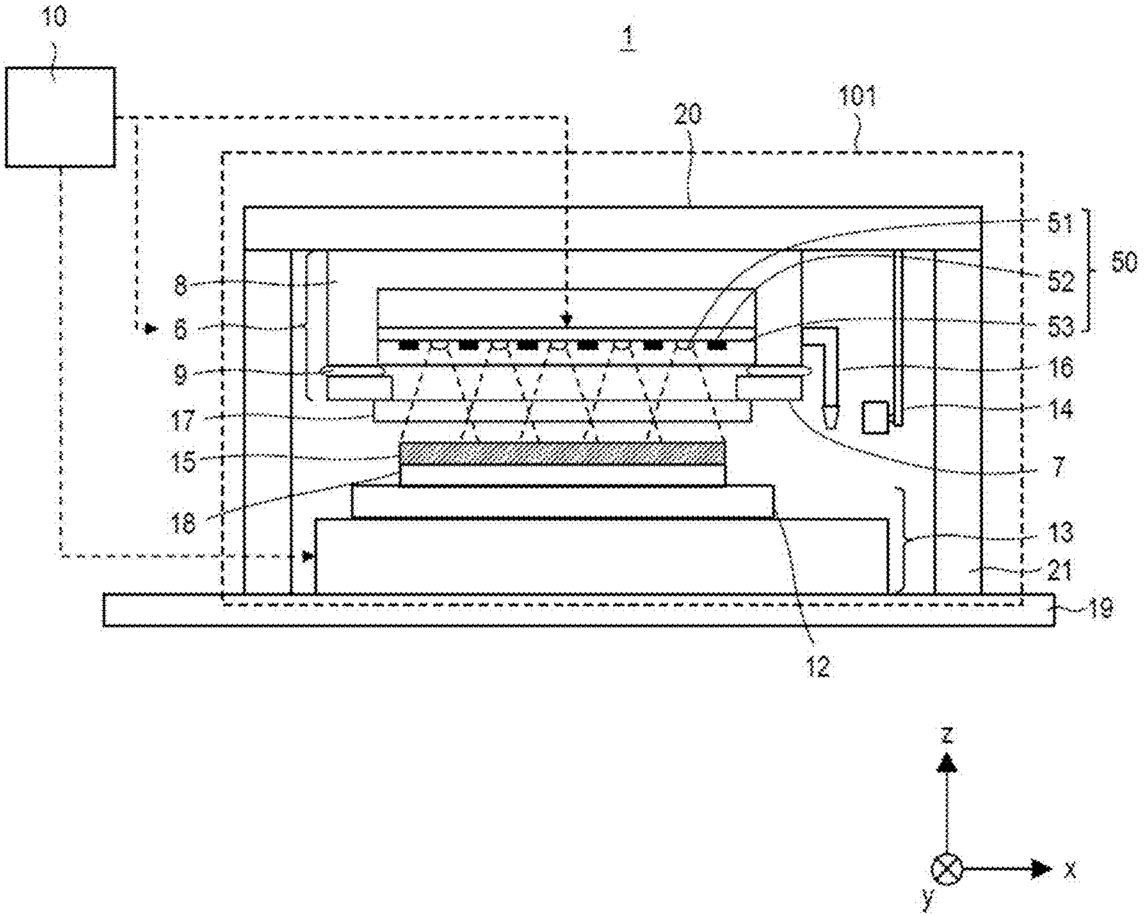
FIG. 1 is a schematic diagram illustrating an imprint apparatus including an illuminating apparatus according to a first example.

Hereinafter, examples will be described in detail with reference to the accompanying drawings. Note that the following examples do not limit the disclosure as in the claims. Although a plurality of features is described in the examples, not all of the plurality of features is essential to the disclosure, and the plurality of features may be arbitrarily combined.

In the accompanying drawings, the same or similar components are denoted by the same reference numerals, and redundant description thereof is omitted. Although the imprint apparatus is described in the present example, the present disclosure is not limited thereto. The present disclosure can also be applied to an exposure apparatus which forms a pattern by exposing a photosensitive agent coated on a substrate, and a drawing apparatus which forms a pattern on a substrate by performing drawing on the substrate by a charged particle beam such as an electron beam or an ion beam through a charged particle optical system.

In a photolithography process for manufacturing a device such as a semiconductor device, an exposure apparatus for transferring a pattern formed on an original (a mask or a reticle) to a substrate (a silicon substrate or a glass substrate) coated with a photosensitive agent is generally used. Similarly, an imprint apparatus that forms a pattern of an imprint material on a substrate by curing the imprint material in a state in which a mold is in contact with the imprint material on the substrate is also used. As one example of a lithography process, a planarization apparatus is also used which forms a composition on a substrate so as to be planarized using a mold (planar template) having a planar portion without an uneven pattern. Also, in this imprint apparatus, since exposure may be performed when the imprint material is cured, the description below will be made with the exposure apparatus including the imprint apparatus, the original including the mold and the photosensitive material including the imprint material.

In the exposure apparatus, miniaturization of a pattern to be transferred onto a substrate progresses, and even a slight change in exposure conditions causes an increase in defect rate and a decrease in yield.

Therefore, in the illumination optical system for illuminating the original, a defect in which the line width of the pattern formed on the substrate becomes uneven due to the illuminance unevenness in the illumination region is suppressed by controlling the integrated exposure light amount in the illumination region to be uniform. For example, in a conventional light source apparatus in which a mercury lamp light source or an excimer laser light source is used, an optical element, a variable slit, or the like in the light source apparatus is used. In addition, in a light source apparatus such as a light emitting diode having a plurality of light emitting portions, a technique is disclosed in which illuminance unevenness due to non-lighting of the light emitting portions is detected by a change in electrical characteristics of the light emitting portions themselves, or a sensor is disposed in the vicinity of the light emitting portions to control the illuminance unevenness from the amount of diffused light or diffusely reflected light.

However, in the method of monitoring the amount of diffused light or diffusely reflected light, the influence of diffused light, diffusely reflected light, or the like other than the light emitting portion to be controlled cannot be ignored. The present disclosure has been made in view of the problems of the related art, and an object of the present disclosure is to provide an illuminating apparatus which is beneficial for illuminating a surface to be illuminated.

First Embodiment

First, an outline of the imprint apparatus according to the present embodiment will be described. An imprint apparatus is an apparatus in which that forms a pattern of a cured product to which a concavo-convex pattern of a mold is transferred by bringing an imprint material (composition) supplied onto a substrate into contact with a mold and applying curing energy to the imprint material.

As the imprint material, a curable composition (sometimes referred to as an uncured resin) that is cured when energy for curing is applied is used. As the curing energy, electromagnetic waves, heat, or the like can be used. The electromagnetic wave can be, for example, light whose wavelength is selected from the range of 10 nm or more and 1 mm or less, such as infrared rays, visible light, and ultraviolet rays. The curable composition may be a composition that is cured by irradiation with light or by heating. Among these, the photocurable composition which is cured by irradiation with light contains at least a polymerizable compound and a photopolymerization initiator, and may further contain a non-polymerizable compound or a solvent as necessary. The non-polymerizable compound is at least one selected from the group consisting of a sensitizer, a hydrogen donor, an internally added mold release agent, a surfactant, an antioxidant, and a polymer component.

The imprint material can be disposed on the substrate in a droplet form, or in an island form formed by connecting a plurality of droplets or a film form, by the imprint material supply unit. The viscosity (viscosity at 25° C.) of the imprint material may be, for example, 1 mPa·s or more and 100 mPa·s or less. Examples of the material of the substrate include glass, ceramics, metals, semiconductors, and resins. If necessary, a member made of a material different from that of the substrate may be provided on the surface of the substrate. The substrate is, for example, a silicon wafer, a compound semiconductor wafer, or quartz glass.

FIG. 1 is a schematic diagram illustrating a configuration of an imprint apparatus 1 according to the present embodiment. The imprint apparatus 1 performs imprint processing in which the imprint material 15 on the substrate 18 and the mold 17 are brought into contact with each other in the transfer unit 101 to form a pattern of the imprint material. The imprint processing by the imprint apparatus 1 can include supplying the imprint material 15 onto the surface of the substrate 18, and curing the imprint material 15 in a state where the mold 17 is in contact with the imprint material 15 (hereinafter, referred to as mold press processing).

The imprint apparatus 1 according to the present embodiment adopts a photocuring method in which an imprint material is cured by irradiation with ultraviolet rays (UV light). Therefore, the imprint apparatus 1 cures the imprint material 15 by irradiating the imprint material 15 with ultraviolet rays from the light emitting portion 51 configured in the light source apparatus 50 in a state where the imprint material 15 on the substrate 18 and the mold 17 are in contact with each other. Thereby, a pattern of the imprint material is formed on the substrate 18. However, the imprint apparatus 1 may cure the imprint material 15 by irradiation with light in other wavelength regions.

Conventionally, a highly volatile material has been used as the imprint material 15. For this reason, a method in which application to the next imprint shot is repeated every time a mold pressing process is performed has been generally used. In recent years, since the imprint material 15 having low volatility has been developed, a method of applying the entire surface to the substrate 18 by spin coating or the like in advance has been adopted. According to the spin coating, since it is possible to omit the step of applying the imprint material 15 to the next imprint shot for each mold pressing, it is possible to expect an improvement in productivity. In the present embodiment, a configuration in which the entire surface of a substrate is collectively coated will be mainly described. In either method, as described later, the reduction of the illuminance unevenness of the light source apparatus 50 is effective in improving the imprint performance.

In addition, in the following, a method of repeating the mold pressing process without sandwiching the process of supplying the imprint material 15 in the middle after the imprint material 15 is collectively supplied onto the surface of the substrate 18 is described, but the present disclosure is not limited thereto. For example, the imprint process may be performed by supplying the imprint material 15 onto the surface of the substrate 18 not collectively but partially, and alternately repeating the supply of the imprint material 15 and the mold pressing process. In both cases, in the present embodiment, the reduction of the illuminance unevenness of the light source apparatus 50 is effective in improving the imprint performance.

Here, directions orthogonal to each other in a plane along the surface of the substrate to which the imprint material 15 is supplied are defined as x-axis and y-axis, and a direction perpendicular to the x-axis and the y-axis is defined as z-axis.

The imprint apparatus 1 is provided with the light source apparatus 50, and can include the imprint head 6 that holds the mold 17, the substrate stage 13 that holds the substrate 18, the supply unit 14, the alignment measurement unit 16, and the controlling unit 10. The light source apparatus 50 irradiates the mold 17 with ultraviolet rays during the imprint process. The light source apparatus 50 includes, for example, an optical system (not illustrated) or a sensor 52 for adjusting the ultraviolet light emitted from the light emitting portion 51 to light suitable for curing the imprint material 15.

The mold 17 is, for example, a mold having a rectangular outer peripheral portion and a pattern region in which a concave-convex pattern formed on the imprint material 15 supplied onto the substrate 18 is formed in a three-dimensional shape on a surface facing the substrate 18. Alternatively, the outer peripheral portion may be circular. As the material of the mold 17, a material that transmits ultraviolet rays such as quartz is used.

The imprint head 6 includes, for example, a mold chuck 7, a mold stage 8, and the like. The mold chuck 7 holds the mold 17 by a holding means such as a vacuum suction force or an electrostatic attraction force. The mold chuck 7 is held on the mold stage 8 by mechanical holding means. The mold stage 8 includes a driving system 9 for determining the distance between the mold 17 and the substrate 18 when the mold 17 and the substrate 18 are brought into contact with each other, and moves the mold 17 in the z-axis direction. The driving system of the mold stage 8 may have a function of moving the mold 17 not only in the z-axis direction but also in, for example, the x-axis direction, the y-axis direction, and the θ-direction (rotational directions around the x-axis, the y-axis, and the z-axis).

The substrate stage 13 holds the substrate 18 and corrects the translational shift of the mold 17 and the substrate 18 in a x-y plane when the mold 17 and the substrate 18 are brought into contact with each other. The substrate stage 13 includes a substrate chuck 12. The substrate chuck 12 attracts and holds the substrate 18. As a method of attracting the substrate 18, vacuum adsorption, electrostatic attraction, or other attraction methods may be used. The substrate stage 13 includes a drive system that drives the mold 17 and the substrate 18 in the x-axis direction and the y-axis direction for correcting a translational shift in the x-y plane. Further, the drive system in the x-axis direction and the y-axis direction may include a plurality of drive systems such as a coarse drive system and a fine drive system. Further, a drive system for adjusting the position in the z-axis direction, a function of adjusting the position of the substrate 18 in the 0 (rotation about the z-axis) direction, and a tilt function for correcting the tilt of the substrate 18 may be provided.

The substrate 18 may be a member made of glass, ceramics, metal, semiconductor, resin, or the like. If necessary, a layer made of a material different from that of the member may be formed on the surface of the member. The substrate 18 is, for example, a silicon wafer, a compound semiconductor wafer, or a quartz glass plate. The transfer unit 101 can form a pattern on the substrate 18 by repeating the imprint process for each of a plurality of shot regions. Alternatively, the entire surface of the substrate 18 may be imprinted at once. In addition to the substrate 18 for forming a pattern, a substrate dedicated to maintenance for detecting a foreign substance or the like may be used as the substrate 18. The imprint apparatus 1 may further include a base surface plate 19 for holding the substrate stage 13, a bridge surface plate 20 for holding the imprint head 6, and a support column 21 for supporting the bridge surface plate 20.

In a case where the supply of the imprint material is performed for each imprint process instead of the batch application of the imprint material on the entire surface in advance, the supply unit 14 (dispenser) is configured in the apparatus. The supply unit 14 includes, for example, a discharge nozzle (not illustrated), and supplies the imprint material 15 onto the substrate 18 from the discharge nozzle.

In the present embodiment, a resin having a property of being cured by ultraviolet rays is used as an example of the imprint material 15. The amount of the supplied imprint material 15 may be determined by the thickness of the necessary imprint material, the pattern density to be formed, and the like.

The alignment measurement unit 16 is a measurement unit that detects alignment marks formed on the mold 17 and the substrate 18 and measures positional deviations and shape differences in the x-axis direction and the y-axis direction between a pattern formed on the substrate and a pattern region of the mold. The controlling unit 10 is a controlling unit that controls the operation, adjustment, and the like of each unit constituting the imprint apparatus 1. The controlling unit 10 is configured by, for example, a computer or the like, is connected to each unit configuring the imprint apparatus 1 via a line, and can execute control of each unit in accordance with a program or the like.

Example 1

An illuminating apparatus according to a first example of the present disclosure will be described with reference to FIGS. 2A and 2B.

The illuminating apparatus of the present disclosure includes a light emitting portion 51, a mounting table (substrate chuck 12) on which an object (substrate 18) irradiated with light from the light emitting portion 51 is mounted, a sensor 52 that detects the amount of light emitted from the light emitting portion 51 and reflected by the object, and an adjusting unit (first moving unit) 31 that adjusts the distance between the object and the sensor 52. In addition, the illuminating apparatus includes the controlling unit 10 that controls the light amount of the light emitting portion 51 based on the detection result of the sensor 52 in a state in which the distance between the object and the sensor 52 is adjusted by the adjusting unit 31.

In the light source apparatus 50, the light emitting portion 51 and the sensor 52 are fixed to the mounting substrate 53 and are integrally formed. For simplicity, the housing, cables, and other components are not shown. The light emitting portion 51 includes a plurality of light emitting elements, and the sensor 52 includes a plurality of light receiving elements. The light emitting portion 51 may include a plurality of LED elements. The ratio of the number of the sensors 52 relative to the number of the plurality of light emitting elements constituting the light emitting portion 51 may be, for example, 0.2 or more and 1 or less, but the illuminating apparatus of the present disclosure is not limited to this ratio. It is preferable that the sensor 52 is disposed in a substantially evenly distributed manner with respect to the plurality of light emitting elements constituting the light emitting portion 51.

An adjusting unit 31 movable in the z direction with respect to the substrate chuck 12 is provided below the substrate chuck 12. The adjusting unit 31 is provided with a plurality of arm portions 31*a* protruding toward the z direction side. When the adjusting unit 31 is raised (moves in the +z direction), the arm portion 31*a* can protrude upward (toward the +z direction) from the upper surface of the substrate chuck 12 through the plurality of openings 12*a* provided in the substrate chuck 12. Thus, the substrate 18 placed on the substrate chuck 12 can be moved from the substrate chuck 12 to a side of the light source apparatus 50. In addition, the controlling unit 10 can control the amount of movement of the substrate 18 from the upper surface of the substrate chuck 12 by the adjusting unit 31.

Figure 2A:
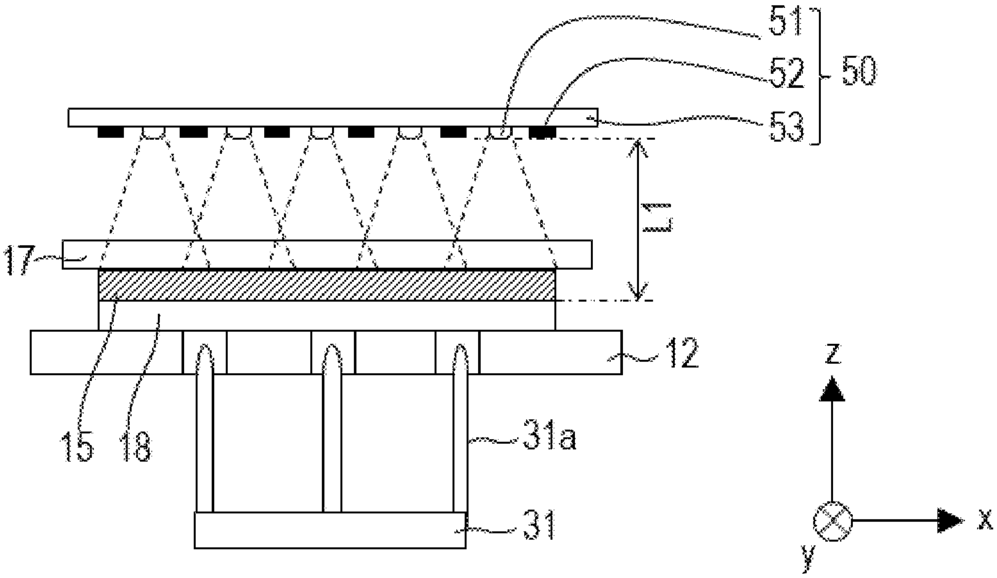
FIG. 2A is a schematic diagram of a main part of the illuminating apparatus according to the first example.

FIG. 2A is a schematic diagram illustrating a state in which the imprint material 15 on the substrate 18 is cured in the imprint process in the present disclosure. The imprint material 15 is applied to the substrate 18, and the mold 17 is pressed (mold-pressed) against the imprint material 15. In this state, the imprint material 15 is irradiated with ultraviolet rays from the light emitting portion 51, and the imprint material 15 is cured.

Figure 2B:
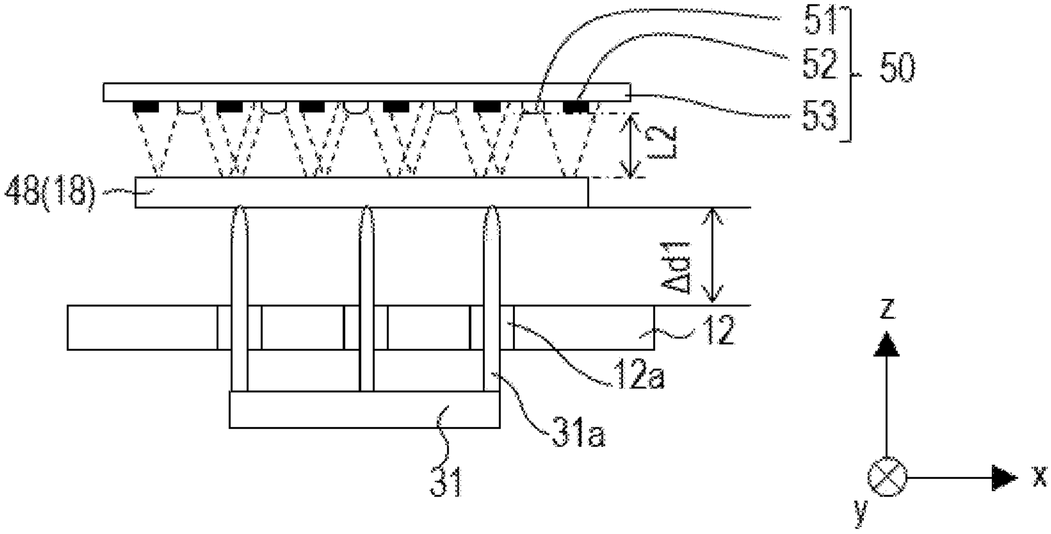
FIG. 2B is a schematic diagram of a main part of the illuminating apparatus according to the first example.

FIG. 2B is a diagram illustrating a state when illuminance measurement is performed in the illuminating apparatus of Example 1. FIG. 2B is a diagram illustrating a state in which the reflection plate 48 is moved toward the sensor 52 side by $\Delta d1$ in the z-axis direction by the adjusting unit 31 and is brought close to the light source apparatus 50 so that a distance from the light emitting portion 51 to the sensor 52 via the reflection surface of the reflection plate 48 and a distance between the light emitting portion 51 and the imprint material 15 serving as the irradiated surface are substantially equal to each other. As the reflection plate 48, an unprocessed (unexposed) substrate (bare substrate) 18 may be used, or a member having a high reflectance, for example, a mirror may be used. At this time, the light emitted from the light emitting section 51 is reflected by the reflection plate 48 and illuminates the sensor 52. In this state, the sensor 52 can measure the illuminance (light amount) of light having an illuminance distribution substantially equal to that of light irradiating the imprint material 15 during the imprint process of FIG. 2A. The illuminance unevenness is calculated by the controlling unit 10 from the illuminance obtained by the sensor 52, and the light amount of the light emitting portion 51 is independently controlled so that the illuminance unevenness falls within a desired range.

The above-described illuminance measurement may be performed at the switching timing of the lot or the mold of the exposure process.

The illuminance distribution detected by the sensor 52, in particular, the level of the measured value varies depending on the reflectance of the reflector 48 to be used, and the like. Therefore, by acquiring the relationship between the illuminance distribution obtained by the method of the present disclosure and the actual illuminance distribution on the imprint material 15 in advance for each reflection plate 48 to be used, the actual illuminance distribution on the imprint material 15 can be more accurately obtained from the illuminance distribution obtained by the present method.

In addition, the change in illuminance from the initial state can be obtained by controlling the trend of the measured change in illuminance distribution from the new initial state of the light emitting portion 51.

Based on the obtained illuminance distribution, the light emission intensity (light amount) of the light emitting portion 51 is independently controlled by the controlling unit 10 so that the illuminance distribution on the imprint material 15 becomes uniform and the decrease in illuminance from the initial state is suppressed. The control of the light emission intensity (light amount) of the light emitting portion 51 by the controlling unit 10 may be controlled for each individual light emitting element (for example, LED element) constituting the light emitting portion 51, or may be controlled by grouping a predetermined number of light emitting elements as a controlling unit.

In a case where the light emission intensity of the light emitting portion 51 is entirely decreased from the initial state, the irradiation time may be controlled by the controlling unit 10 so that the integrated illuminance of the imprint material 15 becomes a predetermined value or a predetermined range. In addition, when the irradiation time exceeds the predetermined time as a result of controlling the irradiation time by the controlling unit 10 so that the integrated illuminance is within the predetermined range, it may be determined that it is the timing to replace the light emitting portion 51.

When the reflection plate 48 is driven in the z-axis direction by the adjusting unit 31 and the illuminance is measured by the sensor 52, it is preferable that the angle $\alpha$ formed between the surface of the reflection plate 48 moved in the z-axis direction and brought close to the mounting substrate 53 and the mounting substrate 53 satisfies the following inequality (1).

$$0 \le \alpha < 30 \times 10^{-3} \text{ rad} \tag{1}$$

It is more preferable that the angle $\alpha$ satisfies the inequality (1a).

$$0 \le \alpha < 10 \times 10^{-3} \text{ rad} \tag{1a}$$

It is even more preferable that the angle $\alpha$ satisfies the inequality (1b).

$$0 \le \alpha < 3 \times 10^{-3} \text{rad} \tag{1b}$$

In addition, when the illuminance is measured by the sensor 52, the distance L0 from the light emitting portion 51 to the sensor 52 via the reflection surface of the reflection plate 48 is set to be substantially equal to the distance L1 between the light emitting portion 51 and the imprint material (composition) 15 serving as the irradiated surface during the exposure processing. It is preferable that the distance L0 satisfies the following inequality (2').

$$0.90 < L1/L0 < 1.10 \tag{2'}$$

Here, in the present embodiment, the distance from the light emitting portion 51 to the reflection surface of the reflection plate 48 and the distance from the reflection surface of the reflection plate 48 to the sensor 52 are equal to each other, and are the distance L2 as shown in FIG. 2B. Therefore, since the distance L0 from the light emitting portion 51 to the sensor 52 via the reflection surface of the reflection plate 48 is (2×L2), it is preferable that the distance L2 satisfies the following inequality (2).

$$0.90 < L1/(2 \times L2) < 1.10 \tag{2}$$

It is more preferable that the distance L1 satisfies Conditional Expression (2a).

$$0.98 < L1/(2 \times L2) < 1.02 \tag{2a}$$

It is even more preferable that the distance L1 satisfies the inequality (2b).

$$0.995 < L1/(2 \times L2) < 1.005 \quad (2b)$$

According to the illuminating apparatus of the present embodiment, it is possible to provide an illuminating apparatus capable of illuminating the imprint material 15 on the substrate 18 with reduced unevenness in illuminance in the exposure process and advantageous for illuminating the surface to be illuminated.

Example 2

An illuminating apparatus according to a second example will be described with reference to FIGS. 3A and 3B. Configurations different from those of the first example will be described, and configurations similar to those of the first example will be denoted by the same names and symbols, and a detailed description thereof will be omitted.

The light source unit 60 according to the second example is different from the light source apparatus 50 according to the first example in the configuration, and the light emitting portion 61 and the sensor 62 are mounted (fixed) on a light emitting portion substrate (first substrate) 63 and a sensor substrate (second substrate) 64 which are different from each other. The light emitting portion substrate 63 and the sensor substrate 64 are disposed so as to be parallel to each other. For simplicity, other components such as a housing and a cable are not shown. The light emitting portion substrate 63 and the sensor substrate 64 are disposed in this order from the substrate 18 side which is the irradiated portion. In the z direction in the drawing, the sensor substrate 64 is disposed at a position further away from the reflection plate 48 (18) than the light emitting portion substrate 63. The light emitting portion substrate 63 is provided with a plurality of openings 65, and the sensor 62 fixed to the sensor substrate 64 is disposed at a position corresponding to the openings 65 in the xy plane.

Figure 3A:
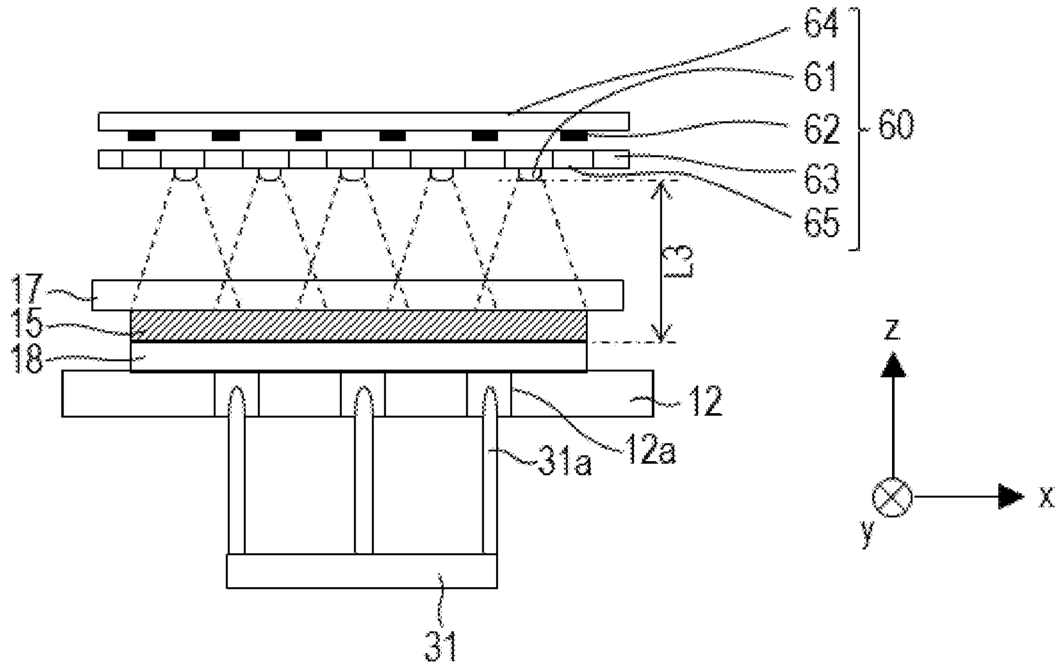
FIG. 3A is a schematic diagram of a main part of an illuminating apparatus of a second example.

FIG. 3A is a schematic view when the curing process of the imprint material 15 on the substrate 18 is performed using the illuminating apparatus of the present example. The imprint material 15 is applied to the substrate 18, and the mold 17 is pressed (mold-pressed) against the imprint material 15. In this state, ultraviolet ray is irradiated from the light emitting portion 61, and the imprint material 15 is cured. FIG. 3B is a diagram illustrating a state when illuminance measurement is performed in the illuminating apparatus of the second example.

Figure 3B:
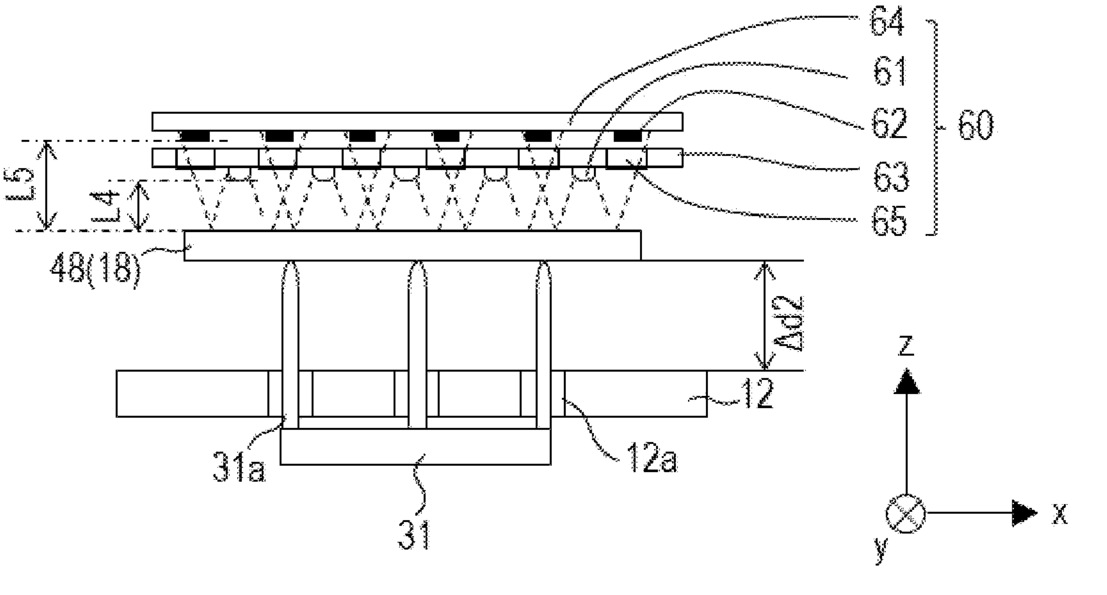
FIG. 3B is a schematic diagram of a main part of the illuminating apparatus of the second example.

FIG. 3B is a diagram illustrating a state in which the reflection plate 48 is brought closer to the light source unit 60 by Δd2 in the z-axis direction so that the sum of the distance from the light emitting portion 61 to the reflection surface of the reflection plate 48 and the distance from the reflection surface to the sensor 62 is substantially equal to the distance between the light emitting portion 61 and the imprint material 15 serving as the irradiated surface in FIG. 3A. At this time, the light emitted from the light emitting section 61 is reflected by the reflection plate 48 and illuminates the sensor 62. The sensor 62 can measure the illuminance of light having an illuminance distribution substantially equal to that of light illuminating the imprint material 15 in FIG. 3A.

The illuminance unevenness is calculated from the light amount obtained by the sensor 62 by the controlling unit 10 illustrated in FIG. 1, and the light amount of the light emitting portion 61 is independently controlled so that the illuminance unevenness falls within a desired range.

When the illuminance is measured by the sensor 62, the distance L6, which is the sum of the distance (L4) from the light emitting portion 51 to the reflecting plate 48 and the distance (L5) from the sensor 62 to the reflecting plate 48, is set to be substantially equal to the distance L3 between the light emitting portion 51 and the imprint material (composition) 15 during the exposure process. More specifically, the distance L6 preferably satisfies the following inequality (3).

$$0.90 < L3/L6 < 1.10 \quad (3)$$

It is more preferable that the distance L6 satisfies the inequality (3a).

$$0.98 < L3/L6 < 1.02 \quad (3a)$$

It is even more preferable that the distance L6 satisfies the inequality (3b).

$$0.995 < L3/L6 < 1.005 \quad (3b)$$

The sensor substrate 64 or the sensor 62 may have a mechanism (second moving means) capable of moving in the z-axis direction relative to the light emitting portion substrate 63.

In many cases, since the light emitting portion 61 generates heat during light emission, the sensor 62 disposed close to the light emitting portion 61 may be thermally affected to affect the measurement accuracy. Therefore, according to the configuration of the illuminating apparatus of the present example, the sensor substrate 64 and the light emitting portion substrate 63 are disposed to be separated from each other in the z direction, so that it is possible to reduce the thermal influence on the measurement accuracy of the sensor 62.

The maximum amount of movement of the adjusting unit 31 in the z direction with respect to the substrate chuck 12 may have a limitation due to limitations on the physical arrangement of the illuminating apparatus. The amount of movement of the adjusting unit 31 in the z direction required to satisfy the relationships of the above inequalities (3) to (3b) becomes smaller as the position of the sensor 62 in the z direction is located closer to the substrate 18. Therefore, by providing a driving unit capable of changing the relative positional relationship between the sensor substrate 64 and the light emitting portion substrate 63 in the z direction, the sensor substrate 64 and the light emitting portion substrate 63 may be brought close to each other (the sensor substrate 64 may be moved toward the light emitting portion substrate 63) at the time of illuminance measurement to reduce the thermal influence on the sensor 62. Accordingly, it is possible to reduce both the thermal influence on the sensor 62 and the necessary movement amount of the adjusting unit 31 in the z direction.

The controlling unit 10 can control the emission intensity of each of the light emitting portion 61 based on the measurement result of the illuminance in the sensor 62 so as to reduce the illuminance unevenness.

According to the illuminating apparatus of the present example, it is possible to provide an illuminating apparatus capable of illuminating the imprint material 15 on the substrate 18 with reduced unevenness in illuminance in the exposure process and advantageous for illuminating the surface to be illuminated.

Example 3

An illuminating apparatus according to a third example of the present disclosure will be described with reference to FIG. 4. Configurations different from those of the first example will be described, and configurations similar to those of the first example will be denoted by the same names and symbols, and a detailed description thereof will be omitted.

Figure 4:
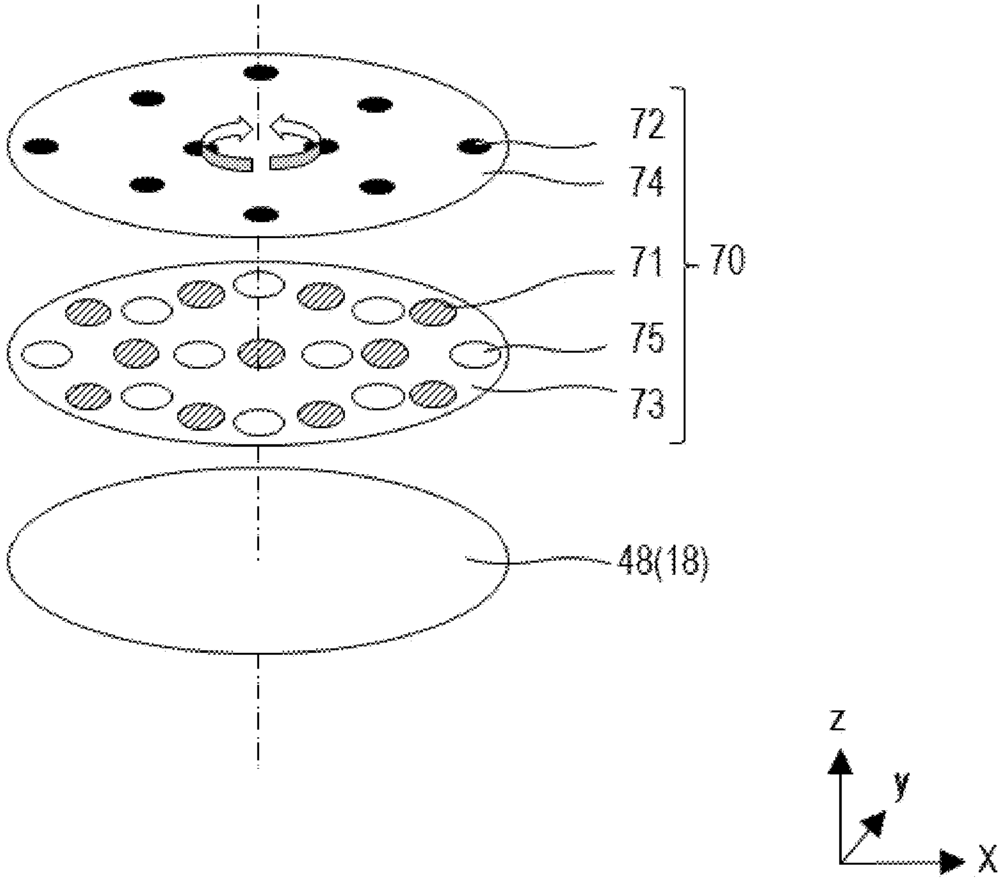
FIG. 4 is a schematic diagram of a main part of an illuminating apparatus according to a third example.

FIG. 4 is a schematic diagram of the light source unit 70 of the illuminating apparatus according to the third example. The light source unit 70 includes a light emitting portion 71, a separate sensor 72, a light emitting portion substrate 73 on which the light emitting portion 71 is mounted, and a sensor substrate 74 on which the sensor 72 is mounted. For simplicity, other components such as a housing and a cable are not shown.

The light emitting portion substrate 73 and the sensor substrate 74 are disposed in this order from the substrate 18 side which is the irradiated portion. In the z direction in the drawing, the sensor substrate 74 is disposed at a position further away from the substrate 18 than the light emitting portion substrate 73. The light emitting portion substrate 73 is provided with a plurality of openings 75, and the sensor 72 fixed to the sensor substrate 74 is disposed at a position corresponding to the openings 75 in the xy plane.

The sensor substrate 74 provided with the sensor 72 is rotatable about the z direction with respect to the light emitting portion substrate 73 provided with the light emitting portion 71. In a plurality of rotational positions between the sensor substrate 74 and the light emitting portion substrate 73, the sensor substrate 74 and the light emitting portion substrate 73 are configured such that each of the sensors 72 fixed to the sensor substrate 74 is at a position corresponding to any of the plurality of openings 75 in the xy plane.

The controlling unit 10 can calibrate the sensors 72 by measuring the illuminance of the reflected light from the reflection plate 48 at a plurality of rotation angles between the sensor substrate 74 and the light emitting portion substrate 73 and comparing the measured values between the plurality of sensors 72 measured through the same opening 75.

In the example of the light source unit 70 shown in FIG. 4, every 180-degree rotation angle between the sensor substrate 74 and the light emitting portion substrate 73 about the z direction, all the sensors 72 are configured to be at positions corresponding to different opening portions 75. In these two rotational positions, measurements can be compared between different sensors 72 for all sensors 72 to calibrate the sensors 72.

Every 90-degree rotation angle of the sensor substrate 74 and the light-emitting portion substrate 73 about the z direction, all the sensors 72 other than the two sensors disposed near the center of the sensor substrate 74 are located at positions corresponding to different openings 75. In this case, in four rotational positions, measurements can be compared and calibrated between different sensors 72 for all sensors 72 except for the two sensors located near the center of the sensor substrate 74.

According to the illuminating apparatus of the third example, the illumination distribution is calculated by the controlling unit 10 based on the light amount obtained by the calibrated sensor 72, so that the calibration of the sensor 72 can also be performed.

The controlling unit 10 can control the emission intensity of each of the light emitting portions 71 based on the measurement result of the illuminance by the sensor 72 so as to reduce the illuminance unevenness on the irradiated surface.

According to the illuminating apparatus of the present example, it is possible to provide an illuminating apparatus capable of illuminating the imprint material 15 on the substrate 18 with reduced unevenness in illuminance in the exposure process and advantageous for illuminating the surface to be illuminated.

As described above, according to the present embodiment and the examples, it is possible to provide an illuminating apparatus advantageous for illuminating a surface to be illuminated, and it is possible to provide an apparatus and a production method that achieve both high productivity and high accuracy.

The illuminating apparatus described above can be applied to an apparatus for illuminating a photocurable resin, an apparatus for inspecting an object by illuminating the object, a lithography apparatus, and the like. For example, the present disclosure can also be applied to an exposure apparatus which performs exposure so as to transfer a pattern of a mask to a substrate, a maskless exposure apparatus, an imprint apparatus which forms a pattern on a substrate using a mold, or a flat layer forming apparatus.

Example of Manufacturing Method

The method of manufacturing an article according to the present example is suitable for manufacturing an article such as a microdevice such as a semiconductor device or an element having a microstructure. The method of manufacturing an article according to the present example includes a step of forming a pattern on a composition applied to a substrate using the imprint apparatus 1 (a step of performing processing on the substrate) and a step of processing the substrate on which the pattern is formed in the step of forming a pattern. Further, the manufacturing method includes other well-known steps (oxidation, film formation, vapor deposition, doping, planarization, etching, composition stripping, dicing, bonding, packaging, and the like). The method of manufacturing an article of the present example is advantageous in at least one of performance, quality, productivity, and production cost of the article as compared with the conventional method.

The pattern of the cured product formed by using the above-described imprint apparatus (molding apparatus) is used permanently for at least a part of various articles or temporarily when various articles are manufactured. The article is an electric circuit element, an optical element, a MEMS, a recording element, a sensor, a mold, or the like. Examples of the electric circuit element include volatile or nonvolatile semiconductor memories such as DRAM, SRAM, flash memory, and MRAM, and semiconductor elements such as LSI, CCD, image sensor, and FPGA. Examples of the mold include a mold for substrate processing such as imprinting.

The pattern of the cured product is used as it is as a constituent member of at least a part of the article, or is temporarily used as a composition mask. After etching, ion implantation, or the like is performed in the processing step of the substrate, the composition mask is removed.

Figure 5A:
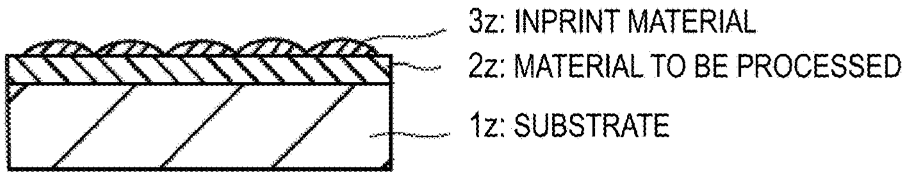
FIG. 5A is a diagram illustrating a method of manufacturing an article.

Next, a specific manufacturing method of the article in the case of using the imprint method as the molding method will be described with reference to FIGS. 5A to 5F. As shown in FIG. 5A, a substrate 1*z* such as a silicon substrate on which a workpiece 2*z* such as an insulator is formed is prepared, and subsequently, a composition 3*z* is applied to the surface of the workpiece 2*z* by an inkjet method or the like. Here, a state in which the composition 3*z* in the form of a plurality of droplets is applied onto the substrate 1*z* is shown.

Figure 5B:
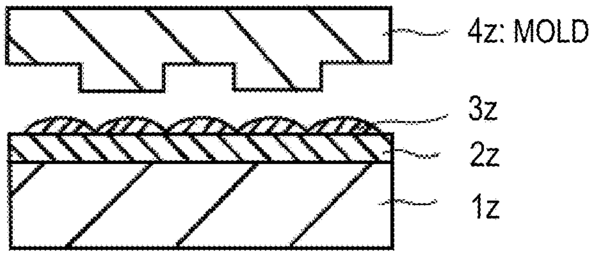
FIG. 5B is a diagram illustrating a method of manufacturing an article.
Figure 5C:
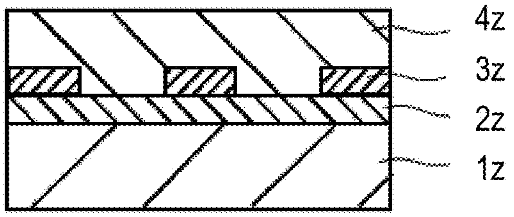
FIG. 5C is a diagram illustrating a method of manufacturing an article.

As shown in FIG. 5B, the mold 4*z* is made to face the composition 3*z* on the substrate 1*z* with its concave-convex pattern formed (contact region) facing the composition 3*z*. As illustrated in FIG. 5C, the substrate 1*z* to which the composition 3*z* has been applied is brought into contact with the mold 4*z*, and pressure is applied (contact step). The gap between the mold 4*z* and the workpiece 2*z* is filled with the composition 3*z*. In this state, when light is irradiated as energy for curing through the mold 4*z*, the composition 3*z* is cured (curing step). At this time, in this example, based on the spectral sensitivity characteristics acquired in the apparatus, it is possible to irradiate the composition with light at an irradiation dose that achieves the optimum photopolymerization degree.

Figure 5D:
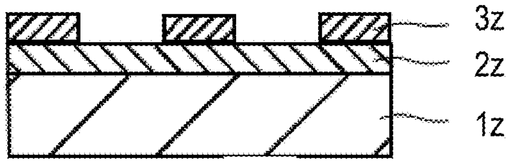
FIG. 5D is a diagram illustrating a method of manufacturing an article.

As shown in FIG. 5D, when the mold 4*z* and the substrate 1*z* are separated from each other after the composition 3*z* is cured, a pattern of a cured product of the composition 3*z* is formed on the substrate 1*z* (pattern forming step, molding step). In the pattern of the cured product, the concave portion of the mold 4*z* has a shape corresponding to the convex portion of the cured product and the concave portion of the mold 4*z* has a shape corresponding to the convex portion of the cured product, that is, the concave-convex pattern of the mold 4*z* is transferred to the composition 3*z*.

Figure 5E:
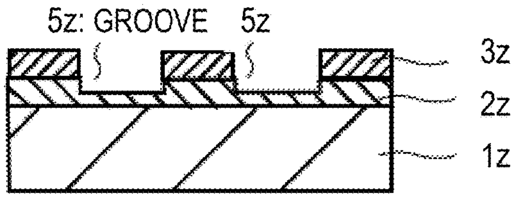
FIG. 5E is a diagram illustrating a method of manufacturing an article.
Figure 5F:
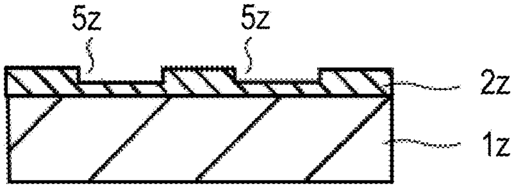
FIG. 5F is a diagram illustrating a method of manufacturing an article.

As shown in FIG. 5E, when etching is performed using the pattern of the cured product as an etching-resistant mask, a portion of the surface of the workpiece 2*z* where the cured product does not exist or remains thinly is removed to form a groove 5*z*. As illustrated in FIG. 5F, when the pattern of the cured product is removed, an article in which the grooves 5*z* are formed on the surface of the workpiece 2*z* can be obtained. Although the pattern of the cured product is removed here, it may be used as a film for interlayer insulation included in a semiconductor element or the like, that is, as a constituent member of an article, for example, without being removed even after processing.

Planarization Process Embodiment

The mold may be a mold (planar template) 170 having a flat surface on which an uneven pattern is not formed as a contact surface (contact region). The planar template 170 is used in a planarization apparatus (molding apparatus) that performs a planarization process (molding process) for planarizing a composition on a substrate by the flat surface. The planarization process includes a step of curing the curable composition by light irradiation in a state where the planar surface (contact surface) 170*a* of the planar template 170 is in contact with the curable composition 150*a* supplied onto the substrate 180. As described above, the present embodiment can be applied to a molding apparatus that molds the composition 150*a* on the substrate 180 using the planar template 170.

The base pattern on the substrate 180 has a concave-convex profile due to the pattern formed in the previous step, and in particular, the substrate (process wafer) 180 may have a step of about 100 nm as the memory element has a multilayer structure in recent years. A step caused by gentle undulation of the entire substrate can be corrected by a focus tracking function of an exposure apparatus (scanner) used in a photolithography process. However, the fine-pitch unevenness within the exposure slit area of the exposure apparatus directly consumes the depth of focus (DOF) of the exposure apparatus. As a conventional technique of planarizing a base pattern of a substrate, a technique of forming a planarization layer such as an SOC (Spin On Carbon) or CMP (Chemical Mechanical Polishing) is used.

Figure 6A:
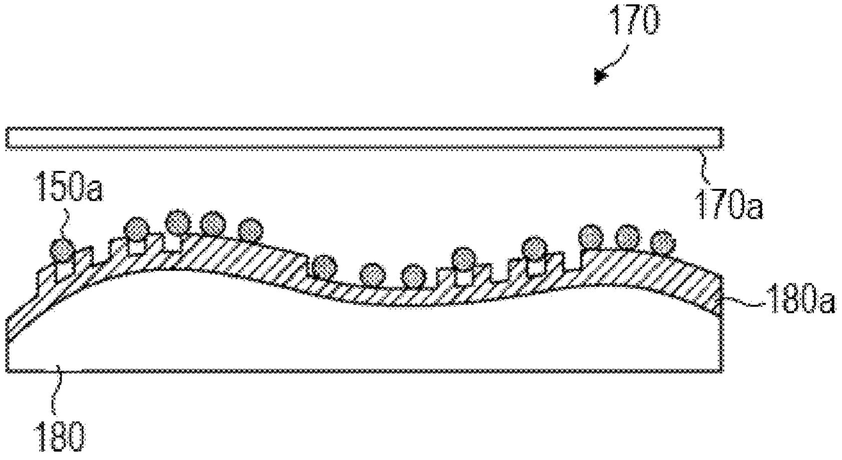
FIG. 6A is a diagram for describing planarization processing.

FIG. 6A shows a state after the composition (resist) 150*a* for forming the planarization layer 150*b* is applied to the substrate 180 on which the base pattern 180*a* is formed and before the planar template 170 is brought into contact with the composition (resist) 150*a*. FIG. 6A shows a state in which the composition 150*a* is applied by an inkjet dispenser based on the technique proposed in U.S. Pat. No. 9,415,418, but a spin coater may be used to apply the composition 150*a*. In other words, the imprint apparatus can be applied as long as it includes a step of pressing and flattening the planar template 170 against the uncured composition 150*a* applied in advance.

Figure 6B:
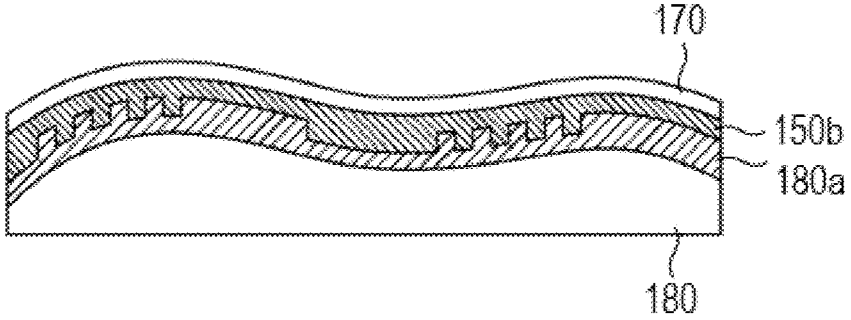
FIG. 6B is a diagram for describing planarization processing.
Figure 6C:
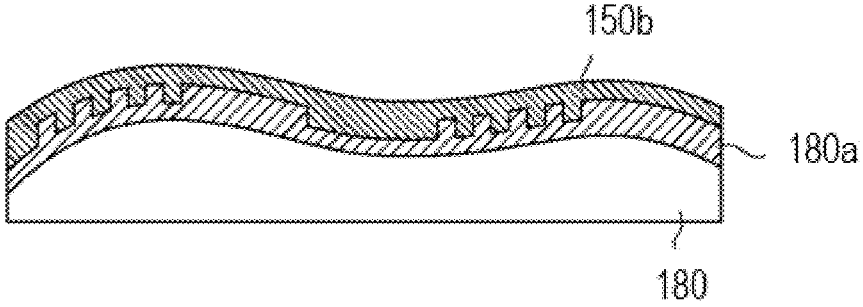
FIG. 6C is a diagram for describing planarization processing.

FIG. 6B shows a state in which the composition 150*a* on the substrate 180 and the planar portion 170*a* of the planar template 170 are completely in contact with each other, and the planar portion 170*a* of the planar template 170 follows the surface shape of the substrate 180. The planar template 170 is made of glass or quartz that transmits ultraviolet rays, and the composition 150*a* is cured by irradiation with ultraviolet rays from a light source. The planar template 170 follows the profile of the surface of the substrate 180 for gentle concave-convex shape in the entire substrate 180. Then, after the composition 150*a* is cured, as shown in FIG. 6C, after the composition 150*a* is cured by irradiating the composition 150*a* on the substrate 180 with light from a light source through the planar template 170, the planar template 170 is separated from the planarization layer (planarization film) 150*b* of the cured composition on the substrate 180, and a state in which the planarization layer 150*b* of the composition having a uniform thickness is formed on the entire surface of the substrate 180 can be obtained.

Although preferred embodiments of the present disclosure have been described above, the present disclosure is not limited to these embodiments, and various modifications and changes can be made within the scope of the gist of the present disclosure. In addition, the above-described embodiments may be implemented in combination.

A part or all of the control in each of the above-described examples may be supplied to the imprint apparatus 1 or the like via a network or various storage media to implement the functions of each of the above-described examples. A computer (or CPU, MPU, or the like) in the imprint apparatus 1 or the like may read and execute the program. In this case, the program and the storage medium storing the program constitute the present disclosure.

While the present disclosure has been described with reference to exemplary examples, it is to be understood that the disclosure is not limited to the disclosed exemplary examples. The scope of the following claims is to be accorded the broadest interpretation so as to encompass all such modifications and equivalent structures and functions.

This application claims the benefit of Japanese Patent Application No. 2023-187625, filed Nov. 1, 2023, which is hereby incorporated by reference herein in its entirety.

What is claimed is:

1. An illuminating apparatus, comprising:

a light emitting portion;

a mounting table on which an object irradiated with a light from the light emitting portion is mounted;
a sensor configured to detect an amount of light emitted from the light emitting portion and reflected by the object;
an adjusting unit configured to adjust a distance between the object and the sensor; and
a controlling unit configured to control a light amount of the light emitting portion based on a detection result of the sensor in an adjusted-distance state in which a distance between the object and the sensor is adjusted by the adjusting unit,
wherein the sensor measures a reflected-light amount after adjustment of the distance between the object and the sensor, and
wherein the controlling unit is configured to control the light amount of the light emitting portion based on the measured reflected-light amount obtained in the adjusted-distance state.

2. The illuminating apparatus according to claim 1, wherein the light emitting portion and the sensor are fixed to a same substrate.

3. The illuminating apparatus according to claim 1,
wherein the light emitting portion is fixed to a first substrate,
wherein the sensor is fixed to a second substrate disposed parallel to the first substrate, and
wherein the first substrate has a plurality of openings through which the sensor receives light from the object.

4. The illuminating apparatus according to claim 1, wherein the adjusting unit includes a first moving unit configured to move the object toward the sensor.

5. The illuminating apparatus according to claim 3, wherein the adjusting unit includes a second moving unit configured to move the second substrate toward the first substrate.

6. The illuminating apparatus according to claim 1, wherein the light emitting portion includes a plurality of light emitting elements, and the sensor includes a plurality of light receiving elements.

7. The illuminating apparatus according to claim 1, wherein the light emitting portion is a plurality of LED elements.

8. The illuminating apparatus according to claim 6, wherein a ratio of a number of the plurality of light receiving elements to a number of the plurality of light emitting elements is 0.2 or more and 1 or less.

9. The illuminating apparatus according to claim 6, wherein the controlling unit is configured to independently control a light amount of each of the plurality of light emitting elements based on a detection result of the sensor.

10. The illuminating apparatus according to claim 6, wherein the controlling unit is configured to divide the plurality of light emitting elements into a plurality of groups and independently control a light amount of each of the plurality of groups based on a detection result of the sensor.

11. The illuminating apparatus according to claim 3,
wherein the second substrate is rotatable relative to the first substrate, and
wherein the controlling unit is configured to perform a calibration of the sensor based on detection results of the sensor at two rotational positions different from each other between the second substrate and the first substrate.

12. A molding apparatus for molding a composition on a substrate using a mold to form an object, the molding apparatus comprising an illuminating apparatus, the illuminating apparatus, comprising:
a light emitting portion;
a mounting table on which the object is mounted and irradiated with a light from the light emitting portion;
a sensor configured to detect an amount of light emitted from the light emitting portion and reflected by the object;
a controlling unit configured to control a light amount of the light emitting portion based on a detection result of the sensor in an adjusted-distance state in which a distance between the object and the sensor is adjusted by the adjusting unit,
wherein the sensor measures a reflected-light amount after adjustment of the distance between the object and the sensor,
wherein the controlling unit is configured to control the light amount of the light emitting portion based on the measured reflected-light amount obtained in the adjusted-distance state, and
wherein the composition on the substrate is exposed to light from the illuminating apparatus.

13. The molding apparatus according to claim 12, wherein the controlling unit is configured to control a light amount of the light emitting portion based on a detection result of the sensor in a state in which a distance between the object and the sensor is adjusted by the adjusting unit so as to satisfy the following inequality, $$0.90 < L1/L0 < 1.10$$

where L0 represents a sum of a distance from the light emitting portion to the object and a distance from the object to the sensor, and L1 represents a distance between the light emitting portion and the composition on the substrate in the exposure process.

14. The molding apparatus according to claim 12,
wherein the mold has a contact region having a pattern to be transferred to the composition on the substrate, and
wherein the molding apparatus is an imprint apparatus that transfers the pattern to the imprint material by bringing the contact region of the mold into contact with an imprint material which is the composition on the substrate.

15. The molding apparatus according to claim 12,
wherein the mold has a flat surface in contact with the composition on the substrate,
wherein the molding apparatus is a planarization apparatus that forms a planarization film of the composition on the substrate by bringing the flat surface of the mold into contact with the composition on the substrate.

16. The molding apparatus according to claim 12, wherein the controlling unit is configured to control the light amount of the light emitting portion based on a detection result of the sensor in a state in which the substrate is disposed at a position different from a position of the substrate when the exposure to the composition on the substrate is performed by the adjusting unit.

17. The molding apparatus according to claim 12, wherein the controlling unit is configured to control the light amount of the light emitting portion based on a detection result of the sensor in a state in which an unprocessed substrate is disposed at a position different from a position of the substrate when the exposure to the composition on the substrate is performed by the adjusting unit.

18. The molding apparatus according to claim 12, wherein the controlling unit is configured to control the light amount of the light emitting portion based on a detection result of the sensor in a state in which a mirror is disposed at a position different from a position of the substrate when the exposure to the composition on the substrate is performed by the adjusting unit.

19. A method for manufacturing article, comprising:

a forming step for forming a composition on a substrate using a molding apparatus, the molding apparatus for molding a composition on a substrate as the object by using a mold to form an object, the molding apparatus comprising an illuminating apparatus, the illuminating apparatus, comprising:

a light emitting portion;

a mounting table on which the object is mounted and irradiated with a light from the light emitting portion;

a sensor configured to detect an amount of light emitted from the light emitting portion and reflected by the object;

an adjusting unit configured to adjust a distance between the object and the sensor; and a controlling unit configured to control a light amount of the light emitting portion based on a detection result of the sensor in an adjusted-distance state in which a distance between the object and the sensor is adjusted by the adjusting unit, wherein the sensor measures a reflected-light amount after adjustment of the distance between the object and the sensor, wherein the controlling unit is configured to control the light amount of the light emitting portion based on the measured reflected-light amount obtained in the adjusted-distance state, and wherein the composition on the substrate is exposed to light from the illuminating apparatus, and a processing step for processing the substrate after the forming step, wherein an article is manufactured from the substrate subjected to the processing step.

* * * * *